United States Patent
Wang et al.

(10) Patent No.: US 7,834,410 B2
(45) Date of Patent: Nov. 16, 2010

(54) SPIN TORQUE TRANSFER MAGNETIC TUNNEL JUNCTION STRUCTURE

(75) Inventors: Yu-Jen Wang, Hsin-Chu (TW); Ya-Chen Kao, Hsin-Chu (TW); Chun-Jung Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 11 days.

(21) Appl. No.: 12/422,579

(22) Filed: Apr. 13, 2009

(65) Prior Publication Data

US 2010/0258886 A1    Oct. 14, 2010

(51) Int. Cl.
*H01L 29/82*    (2006.01)
*G11C 11/02*    (2006.01)

(52) U.S. Cl. .................... 257/421; 257/422; 257/423; 438/3; 365/157; 360/324.2

(58) Field of Classification Search .............. 257/20, 257/414, 421–427, E29.323; 438/3; 360/324–326, 360/313; 365/157–158, 171–173; 29/737
See application file for complete search history.

(56) References Cited

U.S. PATENT DOCUMENTS

| | | | |
|---|---|---|---|
| 7,037,807 B1 | 5/2006 | Murakami et al. | |
| 7,057,921 B2 | 6/2006 | Valet | |
| 7,088,609 B2 | 8/2006 | Valet | |
| 7,233,039 B2 | 6/2007 | Huai et al. | |
| 7,430,135 B2 | 9/2008 | Huai et al. | |
| 2003/0067802 A1* | 4/2003 | Anthony et al. | 365/173 |
| 2004/0233585 A1* | 11/2004 | Boeve | 360/313 |
| 2008/0198514 A1* | 8/2008 | Jogo et al. | 360/324.1 |

OTHER PUBLICATIONS

Arnold, Magnetic Units Conversion (http://www.arnoldmagnetics.com/mtc/conversion.htm) printed Jun. 18, 2010 is provided as a teaching reference of conversion between Oersted and kA/m.*

* cited by examiner

*Primary Examiner*—Bradley K Smith
*Assistant Examiner*—Jami M Valentine
(74) *Attorney, Agent, or Firm*—Haynes and Boone, LLP

(57) ABSTRACT

The present disclosure provides a semiconductor memory device. The device includes a bottom electrode over a semiconductor substrate; an anti-ferromagnetic layer disposed over the bottom electrode; a pinned layer disposed over the anti-ferromagnetic layer; a barrier layer disposed over the pinned layer; a first ferromagnetic layer disposed over the barrier layer; a buffer layer disposed over the first ferromagnetic layer, the buffer layer including tantalum; a second ferromagnetic layer disposed over the buffer layer; and a top electrode disposed over the second ferromagnetic layer.

20 Claims, 4 Drawing Sheets

SPIN TORQUE TRANSFER MAGNETIC TUNNEL JUNCTION STRUCTURE

BACKGROUND

In integrated circuit (IC) devices, spin torque transfer magnetic random access memory (STT-MRAM) is an emerging technology for next generation embedded memory devices. Semiconductor integrated circuit (IC) technology is continually progressing to circuit layouts having smaller feature sizes as well as increased density. However, as a result of this continuous progression, how to reduce the writing current is an important issue for scaling. STT-MRAM includes one transistor and one magnetic tunnel junction (MTJ). In this one transistor and one MTJ (1T1MTJ) type memory, a large writing current will limit the scaling of the transistor and will lead to a large cell size. Some existing approaches may reduce the writing current but will also unexpectedly reduce the tunnel magnetoresistance (TMR) and the thermal stability of the STT-MRAM device. Accordingly, it would be desirable to provide an improved STT-MRAM structure and method of manufacturing thereof absent the disadvantages discussed above.

SUMMARY

One of the broader forms of an embodiment of the present invention involves a semiconductor memory device. The device includes a bottom electrode over a semiconductor substrate; an anti-ferromagnetic layer disposed over the bottom electrode; a pinned layer disposed over the anti-ferromagnetic layer; a barrier layer disposed over the pinned layer; a first ferromagnetic layer disposed over the barrier layer; a buffer layer disposed over the first ferromagnetic layer, the buffer layer including tantalum; a second ferromagnetic layer disposed on the buffer layer; and a top electrode disposed over the second ferromagnetic layer.

Another one of the broader forms of an embodiment of the present invention involves a semiconductor memory device. The device includes a first electrode over a semiconductor substrate; an anti-ferromagnetic layer over the first electrode; a bottom pinned layer over the anti-ferromagnetic layer; a spacer layer over the bottom pinned layer; a top pinned layer over the spacer layer; a barrier layer over the top pinned layer; a first ferromagnetic layer over the barrier layer and having a first coercivity; a second ferromagnetic layer over the first ferromagnetic layer and having a second coercivity less than the first coercivity; and a second electrode adjacent the second ferromagnetic layer.

Yet another one of the broader forms of an embodiment of the present invention involves a method of manufacturing a semiconductor memory device. The method includes forming a bottom electrode over a semiconductor substrate; forming an anti-ferromagnetic layer over the bottom electrode; forming a pinned layer over the anti-ferromagnetic layer; forming a barrier over the pinned layer; forming a first ferromagnetic layer over the barrier layer, the first ferromagnetic layer having a first coercivity; forming a second ferromagnetic layer over the first ferromagnetic layer, the second ferromagnetic layer having a second coercivity less than the first coercivity; and forming a second electrode adjacent the second ferromagnetic layer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
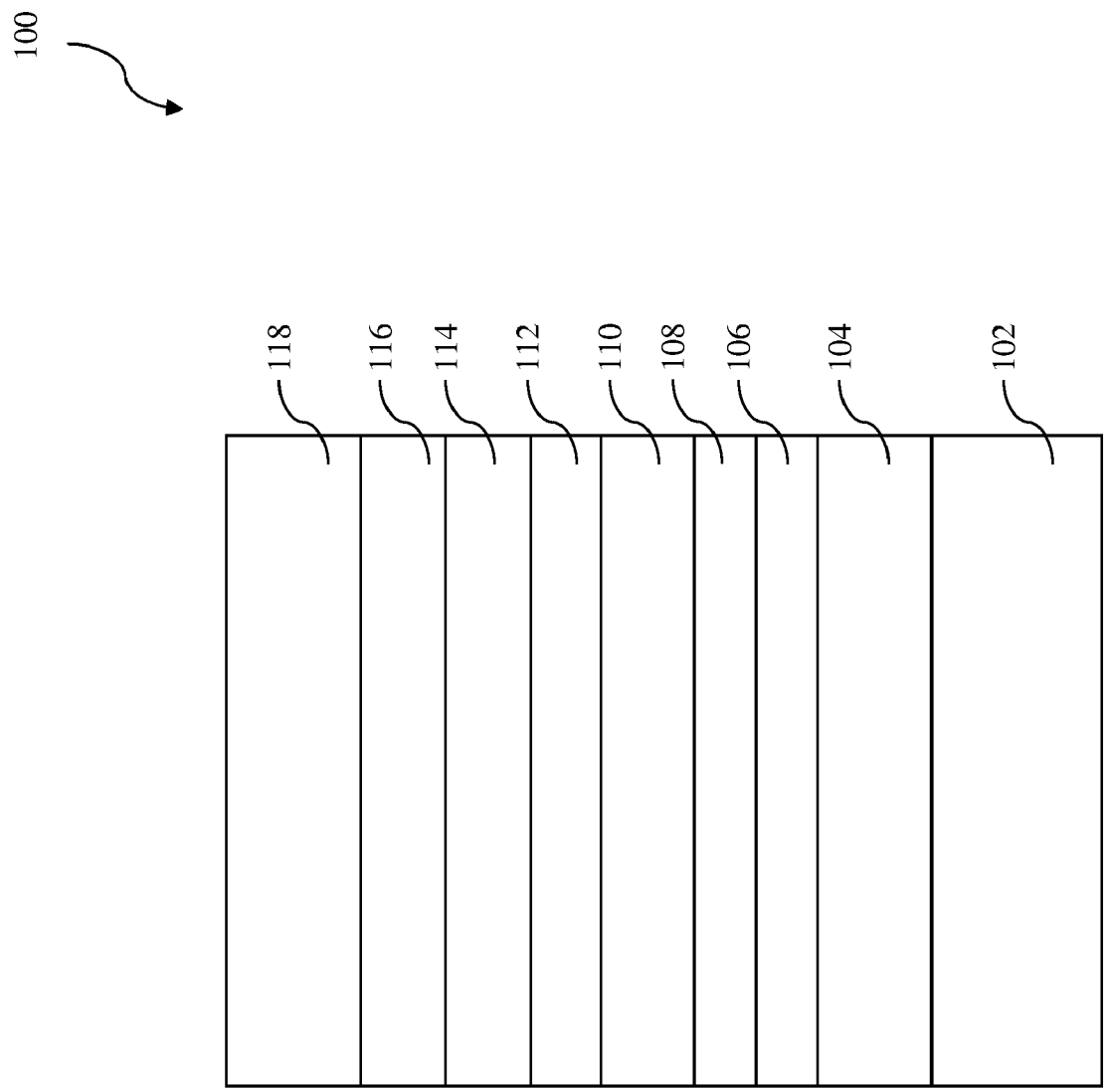
FIG. 1 is a sectional view illustrating an embodiment of a semiconductor memory device constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a sectional view illustrating an embodiment of a semiconductor memory device 100 constructed according to aspects of the present disclosure. With reference to FIG. 1, the semiconductor memory device 100 and the method of making the same are collectively described. The device 100 is a portion of one spin torque transfer magnetic random access memory (STT-MRAM). In one embodiment, the semiconductor memory device 100 includes a stack of material layers functioning as a magnetic tunnel junction (MTJ).

The semiconductor memory device 100 is formed on a semiconductor substrate, such as silicon substrate or alternatively other suitable semiconductor substrate. The semiconductor memory device 100 includes a first electrode (or bottom electrode) 102 of conductive material. In one embodiment, the first electrode 102 includes tantalum. The first electrode 102 can be formed by a physical vapor deposition (PVD or sputtering) or alternatively other suitable processes.

The device 100 includes a pining layer 104 disposed on the first electrode 102. In one embodiment, the pining layer 104 includes an anti-ferromagnetic material. In the anti-ferromagnetic material, the magnetic moments of atoms or molecules align in a regular pattern with neighboring spins pointing in opposite directions. In one example, the anti-ferromagnetic layer 104 includes platinum manganese (PtMn). In another example, the anti-ferromagnetic layer has a thickness ranging between about 100 angstrom and about 200 angstrom. In another example, the anti-ferromagnetic layer may have a thickness of about 150 angstrom.

The device 100 includes a first pinned layer (or bottom pinned layer) 106 disposed on the pining layer 104. In one embodiment, the pinned layer 106 includes a ferromagnetic material layer. The ferromagnetic material can form permanent magnets and/or exhibit strong interactions with magnets. In one embodiment, the ferromagnetic layer 106 includes a cobalt-iron-boron (CoFeB) film. The ferromagnetic material layer may alternatively include other materials, such as CoFeTa, NiFe, Co, CoFe, CoPt, CoPd, FePt, or the alloy of Ni, Co and Fe. The ferromagnetic layer 106 may have a thickness ranging between about 15 angstrom and about 35 angstrom. In one example, the ferromagnetic layer 106 may have a thickness of about 25 angstrom. As one example, the CoFeB film is formed by PVD, or alternatively other suitable process.

The device 100 includes a spacer layer 108 disposed on the first pinned layer 106. In one embodiment, the spacer layer 108 includes ruthenium (Ru). Alternatively, the spacer layer may include other suitable material, such as Ti, Ta, Cu, or Ag. In one example, the spacer layer has a thickness ranging between about 5 angstrom and about 10 angstrom. In another example, the spacer layer 108 may have a thickness of about 8 angstrom. The spacer layer may be formed by a PVD process, or another suitable process.

The device 100 includes a second pinned layer (or top pinned layer) 110 disposed on the spacer layer 108. As one embodiment, the second pinned layer 110 includes a ferromagnetic material layer substantially similar to that of the first pinned layer. For example, the second pinned layer 110 includes a cobalt-iron-boron (CoFeB) film. In one example, the second pinned layer 110 has a thickness ranging between about 15 angstrom and about 35 angstrom. In another example, the second pinned layer 110 may have a thickness of about 25 angstrom. The second pinned layer may be formed by PVD, or other alternative processing method.

The device 100 includes a barrier layer 112 disposed on the second pinned layer 110. The device 100 also includes a first free layer (or bottom free layer) 114 disposed on the barrier layer 112. The barrier layer 112 is interposed between the second pinned layer 110 and the first free layer 114 for the magnetic tunneling effect. The barrier layer 112 includes magnesium oxide (MgO). Alternatively, the barrier layer 112 may include aluminum oxide (AlO), aluminum nitride (AlN), aluminum oxynitride (AlON), or other suitable non-magnetic material. The barrier layer 112 is thin enough such that electrons can tunnel through the barrier layer when a bias voltage is applied on. In one embodiment, the barrier layer 112 has a thickness ranging between about 5 angstrom and about 15 angstrom. In another embodiment, the barrier layer 112 has a thickness of about 10 angstrom. The barrier layer 112 may be formed by a PVD process. For example, a magnesium target is used with an oxygen gas provided in a sputtering chamber to form magnesium oxide. Alternatively, a magnesium film is formed first by sputtering and then converting it into the MgO film by applying an oxygen plasma.

As noted above, The first free layer (or bottom free layer) 114 is disposed on the barrier layer 112. A free layer, such as the first free layer 114, may also include a ferromagnetic material but it is not pinned because there is no anti-ferromagnetic material adjacent the free layer. Therefore, the magnetic orientation of the layer is free, thus referred to as a free layer. The first free layer 114 includes a hard ferromagnetic material having a first coercivity. In one embodiment, the first free layer 114 includes a CoFeB film. In one example, the CoFeB may have compositions expressed in $(Co_xFe_{1-x})_{80}B_{20}$, wherein the x is an alloy mole fraction and ranges between 0 and 100. the subscripts "80" and "20" are also mole fractions. The hard ferromagnetic material layer may have a thickness ranging between about 10 angstrom and about 20 angstrom. In one example, the first free layer 114 may have a thickness of about 15 angstrom. The first free layer 114 may be formed by a process, such as PVD.

The device 100 includes a second free layer (or top free layer) 116 disposed on the first free layer 114. The second free layer 116 includes a soft ferromagnetic material having a second coercivity less than the first coercivity of the first free layer 114. In one embodiment, the second free layer 116 includes a nickel iron (NiFe) film. In another embodiment, the soft ferromagnetic material layer 116 has a thickness less than about 15 angstrom. Otherwise, MR, defined as (R_high– R_low)/R_low), will be unexpectedly reduced as well. The second free layer 116 may be formed by a process, such as PVD.

The device 100 also includes a second electrode (or top electrode) 118 formed on the second free layer 116. In one embodiment, the second electrode 118 directly contacts the second free layer, therefore there is no additional material layer between the second electrode 118 and the second free layer. In one embodiment, the top electrode 118 directly contacts the second free layer 116. In another embodiment, the second electrode 118 includes tantalum. Alternatively, the second electrode includes other suitable conductive material to electrically connect the device to other portion of the interconnect structure for pre-designed electrical routing. The second electrode layer may be formed by a PVD process in one embodiment. In one embodiment of the memory device 100, the hard ferromagnetic layer 114 and the soft ferromagnetic 116 are coupled such that the bottom free layer 114 is softened. The writing current is reduced accordingly.

Figure 2:
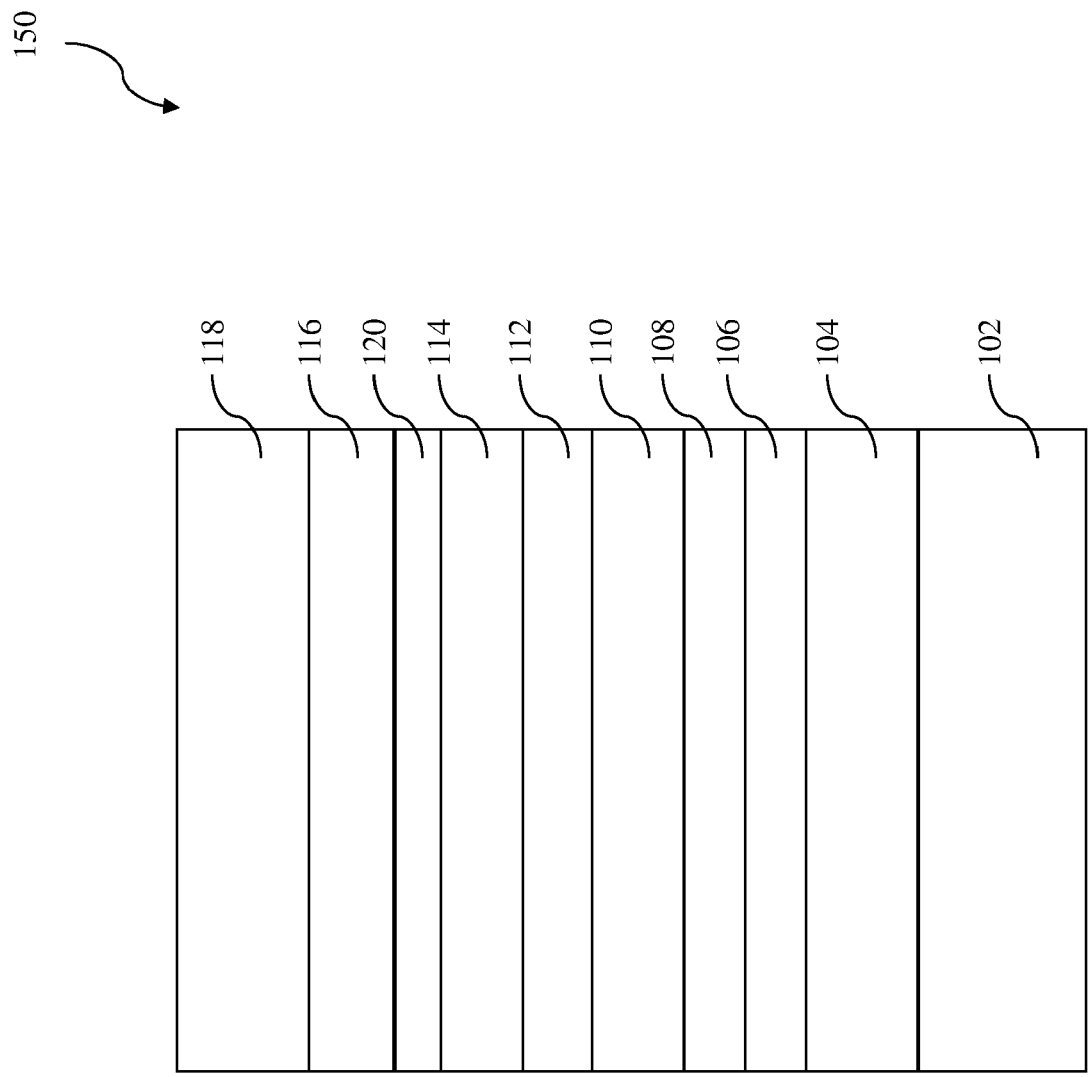
FIG. 2 is a sectional view illustrating another embodiment of a semiconductor memory device constructed according to aspects of the present disclosure.

FIG. 2 is a sectional view illustrating a semiconductor memory device 150 in another embodiment constructed according to aspects of the present disclosure. With reference to FIG. 2, the semiconductor memory device 150 and the method of making the same are collectively described. The device 150 is a portion of one STT-MRAM structure. In one embodiment, the semiconductor memory device 150 includes a stack of material layers functioning as a MTJ.

The semiconductor memory device 150 is formed on a semiconductor substrate substantially similar to the semiconductor substrate of FIG. 1. The semiconductor memory device 150 includes a first electrode (or bottom electrode) 102 of a conductive material. The first electrode 102 is substantially similar to the first electrode of FIG. 1. For example, the first electrode 102 includes tantalum.

The device 150 includes a pining layer 104 disposed on the first electrode. In one embodiment, the pining layer 104 includes an anti-ferromagnetic material. In one example, the anti-ferromagnetic layer 104 includes PtMn. In another example, the anti-ferromagnetic layer has a thickness ranging between about 100 angstrom and about 200 angstrom. In another example, the anti-ferromagnetic layer may have a thickness of about 150 angstrom.

The device 150 includes a first pinned layer (or bottom pinned layer) 106 disposed on the pining layer 104. In one embodiment, the pinned layer 106 includes a ferromagnetic material layer. In one example, the ferromagnetic layer 106 includes a CoFeB film. The ferromagnetic layer may alternatively include other materials, such as CoFeTa, NiFe, Co, CoFe, CoPt, CoPd, FePt, or the alloy of Ni, Co and Fe. The ferromagnetic layer 106 may have a thickness ranging between about 15 angstrom and about 35 angstrom. In one example, the ferromagnetic layer 106 may have a thickness of about 25 angstrom. The CoFeB film may be formed by PVD, or alternatively other suitable process.

The device 150 includes a spacer layer 108 disposed on the first pinned layer 106. In one embodiment, the spacer layer 108 includes Ru. Alternatively, the spacer layer may include other suitable material, such as Ti, Ta, Cu, or Ag. In one example, the spacer layer has a thickness ranging between about 5 angstrom and about 10 angstrom. In another example, the spacer layer 108 may have a thickness of about 8 angstrom. The spacer layer 108 may be formed by a suitable process, such as a PVD process, or another suitable process.

The device 150 includes a second pinned layer (or top pinned layer) 110 disposed on the spacer layer 108. In one embodiment, the second pinned layer 110 includes a ferromagnetic material layer substantially similar to that of the first pinned layer 106. For example, the second pinned layer 110 includes a CoFeB film. In one example, the second pinned layer 110 has a thickness ranging between about 15 angstrom and about 35 angstrom. In another example, the second pinned layer 110 may have a thickness of about 25 angstrom. The second pinned layer 110 may be formed by PVD, or another alternative processing method.

The device 150 includes a barrier layer 112 disposed on the second pinned layer 110. The barrier layer 112 is similar to the barrier layer of FIG. 1 and may include MgO, or may alternatively include AlO, AlN, AlON, or other suitable non-magnetic material. In one embodiment, the barrier layer has a thickness ranging between about 5 angstrom and about 15 angstrom. In another embodiment, the barrier layer 112 has a thickness of about 10 angstrom. The barrier layer 112 may be formed by PVD, or other alternative processing technique.

The device 150 includes a first free layer (or bottom free layer) 114. The first free layer 114 includes a hard ferromagnetic material having a first coercivity. In one embodiment, the first free layer 114 includes a CoFeB film. In one example, the hard ferromagnetic material layer has a thickness ranging between about 10 angstrom and about 30 angstrom. In another example, the hard ferromagnetic material layer has a thickness ranging between about 10 angstrom and about 50 angstrom. In another example, the first free layer 114 has a thickness of about 15 angstrom.

The device 150 includes a second free layer (or top free layer) 116 overlying the first free layer 114. The second free layer 116 includes a soft ferromagnetic material having a second coercivity less than the first coercivity of the first free layer 114. In one embodiment, the second free layer 116 includes a NiFe film. The soft ferromagnetic material layer 116 may have a thickness ranging between about 5 angstrom and about 30 angstrom. In one example, the soft ferromagnetic layer 116 has a thickness of about 18 angstrom. The second free layer 116 may be formed by a process, such as PVD.

The device 150 further includes a buffer layer 120 interposed between the first free layer 114 and the second free layer 116, as illustrated in FIG. 2. In one embodiment, the buffer layer 120 includes a non-magnetic material having a non-periodic structure. In one embodiment, the buffer layer 120 includes an amorphous non-magnetic material. In another embodiment, the buffer layer 120 includes a material compatible with the first free layer 114. In another embodiment, the material of the buffer layer 120 is properly chosen so that the buffer layer 120 does not damage the first free layer 114. For example, the buffer layer 120 should not damage the bcc crystalline structure of the CoFeB. In another embodiment, the buffer layer 120 includes tantalum. In another embodiment, the buffer layer 120 includes an amorphous non-magnetic material. The buffer layer 120 may have a thickness ranging between about 4 angstrom and about 12 angstrom. In one example, the buffer layer 120 has a thickness about 8 angstrom. The tantalum buffer layer 120 is deposited by PVD. Alternatively, the tantalum buffer layer is deposited by an electroless plating process or other suitable process.

The device 150 also includes a second electrode (or top electrode) 118 formed on the second free layer 116. In one embodiment, the second electrode 118 directly contacts the second free layer 116. In one embodiment, the second electrode 118 includes tantalum. Alternatively, the second electrode 118 includes other suitable conductive material to electrically connect the device to other portion of the interconnect structure for pre-designed electrical routing. The second electrode 118 can be formed by a PVD process in one embodiment.

In one embodiment of the memory device 150, a long rang coupling between the hard ferromagnetic layer 114 and the soft ferromagnetic layer 116 is achieved through the buffer layer 120. The first free layer 114 is softened accordingly. Thereby, the writing current is reduced without degrading MR ((R_high−R_low)/R_low).

Figure 3:
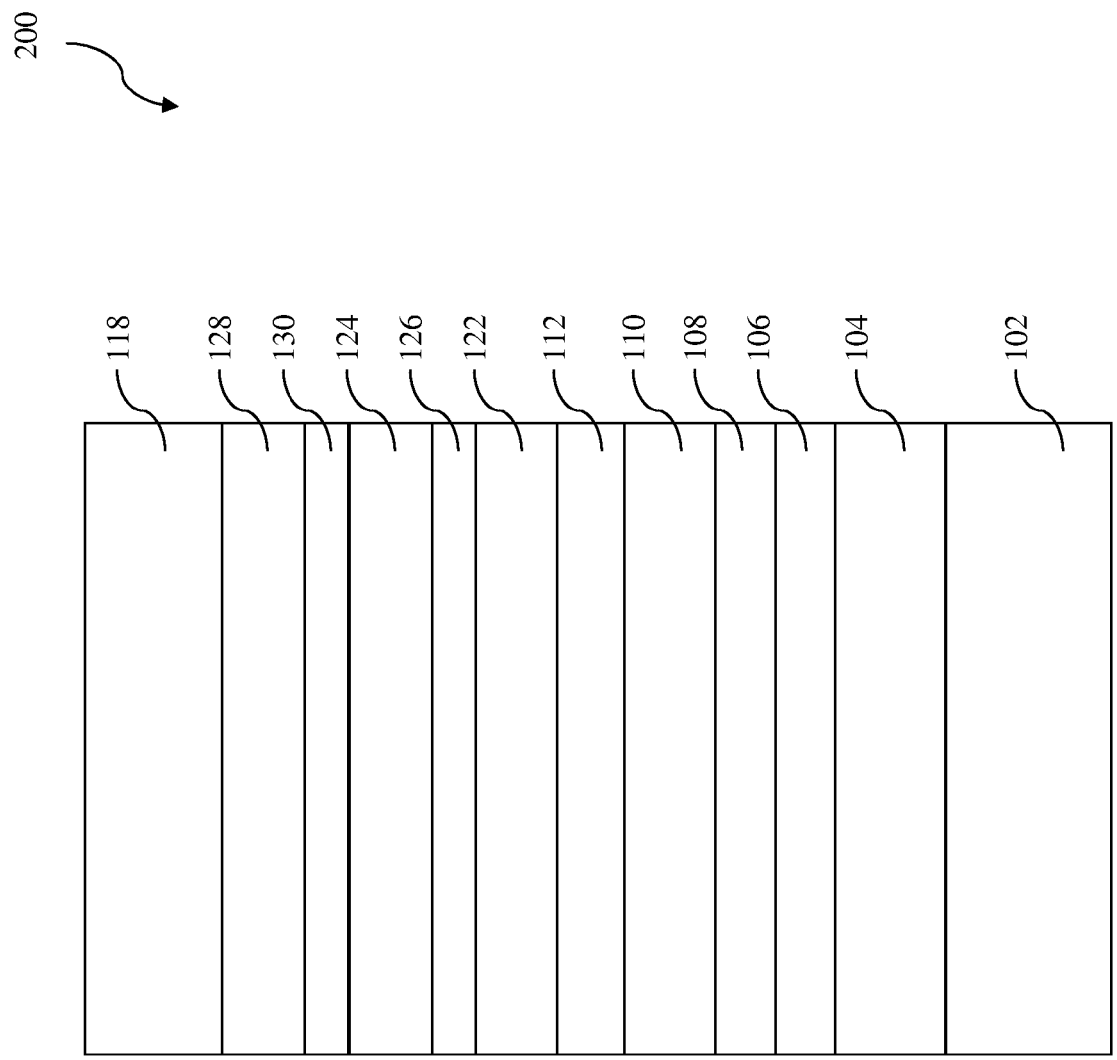
FIG. 3 is a sectional view illustrating yet another embodiment of a semiconductor memory device constructed according to aspects of the present disclosure.

FIG. 3 is a sectional view illustrating a semiconductor memory device 200 in another embodiment constructed according to aspects of the present disclosure. With reference to FIG. 3, the semiconductor memory device 200 and the method of making the same are collectively described. The device 200 is a portion of one STT-MRAM structure. The semiconductor memory device 200 is formed on a semiconductor substrate substantially similar to the semiconductor substrate of FIG. 1 or FIG. 2. The semiconductor memory device 200 includes a first electrode (or bottom electrode) 102, a pining layer 104, a first pinned layer (or bottom pinned layer) 106, a spacer layer 108, a second pinned layer (or top pinned layer) 110, and a barrier layer 112, stacked in a configuration illustrated in FIG. 3. The stacked layers 102 through 112 of the device 200 are substantially similar to the stacked layers 102 through 112 of the device 150 in FIG. 2 in terms of configuration, composition and formation.

The device 200 further includes a first free layer 122. The first free layer 122 includes a ferromagnetic material. In one embodiment, the first free layer 122 includes a CoFeB film. In another embodiment, the first free layer 122 may alternatively include cobalt iron alloy (CoFe) or NiFe. In one example, the first free layer 122 has a thickness ranging between about 10 angstrom and about 30 angstrom. In another example, the first free layer 122 has a thickness of about 15 angstrom.

The device 200 further includes a second free layer 124 overlying the first free layer 122. The second free layer 124 includes a ferromagnetic material. In one embodiment, the second free layer 124 includes a CoFeB film. In another embodiment, the second free layer 124 may alternatively include CoFe or NiFe. In one example, the second free layer 124 has a thickness ranging between about 5 angstrom and about 20 angstrom. In another example, the second free layer 124 has a thickness of about 10 angstrom.

The device 200 further includes a first buffer layer 126 interposed between the first free layer 122 and the second free layer 124, as illustrated in FIG. 3. The first buffer layer 126 may include a non-magnetic material compatible with the first and second free layers 122 and 124. In another embodiment, the first buffer layer 126 includes tantalum. The first buffer layer 126 may have a thickness ranging between about 3 angstrom and about 15 angstrom. In one example, the first buffer layer 126 has a thickness about 5 angstrom. The tantalum buffer layer 126 is deposited by PVD. Alternatively, the tantalum buffer layer 126 is deposited by an electroless plating process or other suitable process.

The device 200 includes a third free layer 128 overlying the second free layer 124. The third free layer 128 includes a ferromagnetic material. In one embodiment, the third free layer 128 includes a NiFe film. In other embodiment, the third free layer 128 alternatively includes CoFeB or CoFe. The third free layer 128 may have a thickness ranging between about 5 angstrom and about 30 angstrom. In one example, the third free layer 128 has a thickness of about 18 angstrom. The third free layer 128 may be formed by PVD or other suitable process.

The device 200 further includes a second buffer layer 130 interposed between the second free layer 124 and the third free layer 128, as illustrated in FIG. 3. The second buffer layer 130 may include a nonmagnetic material compatible with the second free layer 124. In one embodiment, the second buffer layer 130 includes Ru, Cu, or Ru/Cu alloy. The second buffer layer 130 may have a thickness ranging between about 5 angstrom and about 15 angstrom. In one example, the second buffer layer 130 has a thickness about 8 angstrom. The second buffer layer 130 may be formed by PVD or other suitable process.

The device 200 also includes a second electrode (or top electrode) 118 formed on the third free layer 128. In one embodiment, the second electrode 118 directly contacts the third free layer 128. In one embodiment, the second electrode 118 includes tantalum. Alternatively, the second electrode includes other suitable conductive material to electrically connect the device to other portion of the interconnect structure for pre-designed electrical routing. The second electrode 118 can be formed by a PVD process in one embodiment. In one embodiment of the memory device 200, a long rang coupling among the first, second, and third free layers 122, 124, and 128 are achieved. Accordingly, the writing current is reduced without degrading MR ((R_high–R_low)/R_low) and thermal stability.

Figure 4:
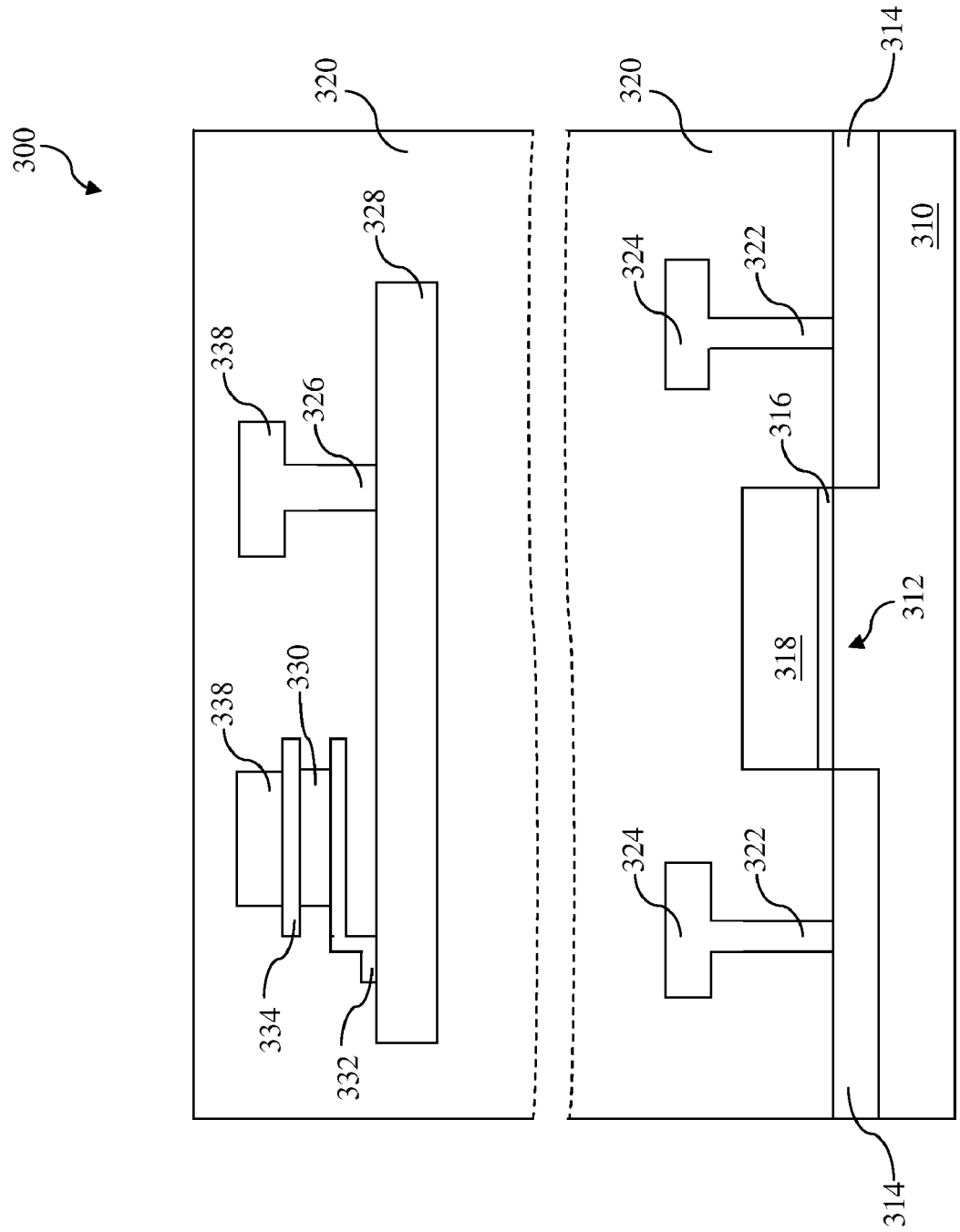
FIG. 4 is a sectional view illustrating an embodiment of an integrated circuit constructed according to aspects of the present disclosure.

FIG. 4 is a sectional view illustrating one embodiment of an integrated circuit constructed according to aspects of the present disclosure. The memory devices 100, 150, 200 of FIG. 1, 2 or 3, respectively, can be implemented in the integrated circuit 300. The integrated circuit 300 and the method of making the same are collectively described with reference to FIG. 4 and additionally to FIGS. 1 through 3. The integrated circuit 300 includes a silicon substrate 310. In other embodiments, the substrate 310 may alternatively or additionally include other semiconductor material such as germanium, gallium arsenic and diamond. The substrate 310 further includes various doped features, such as n-type wells and/or p-type wells, formed by ion implantation or diffusion. The substrate 310 also includes various isolation features, such as shallow trench isolation (STI), formed by a process known in the art, such as a process including etching to form various trenches and then deposition to fill the trench with a dielectric material using chemical vapor deposition (CVD).

The integrated circuit 300 further includes an exemplary metal-oxide-silicon (MOS) transistor 312. The MOS transistor 312 includes source and drain regions 314 formed by a process, such as ion implantation. The MOS transistor 312 further includes a gate stack interposed between the source and drain 314. The gate stack includes a gate dielectric 316 disposed on the substrate and a gate electrode 318 disposed on the gate dielectric 316. The gate dielectric 316 includes one or more dielectric film vertically interposed between the gate electrode and the substrate. In one example, the gate dielectric 316 includes a silicon oxide film formed by a thermal oxidation. In another example, the gate dielectric 316 includes a thermal silicon oxide and a high k film on the thermal silicon oxide. The high k film is a dielectric material having a dielectric constant greater than that of the silicon oxide. The high k film, such as hafnium oxide, can be formed by a process such as atomic layer deposition (ALD), or other suitable method. The gate electrode 318 includes one or more conductive material, such as doped polysilicon, metal, metal alloy, or combinations thereof. The gate electrode 318 can be formed by CVD, PVD or other suitable method. In another embodiment, spacers may be formed adjacent the gate electrodes.

The integrated circuit 300 also includes interconnects on the substrate. The interconnects are designed for electrical connection and routing to enable the integrated circuit to function according to its design. In one example, the interconnects are extended to and electrically connected to the exemplary MOS transistor 312. The interconnects includes various conductive features formed in dielectric material 320 for proper isolation. The various conductive features include contacts 322, metal one (e.g., M1) lines 324, vias 326, and high level metal lines, such as metal 5 (or M5) 328 and metal 6 (or M6) 338. The various conductive features may include copper, tungsten, titanium, titanium nitride, gold, aluminum, alloy thereof, carbon nano-tubes, and/or other suitable materials, and may be formed by CVD, PVD, plating and/or other processes. The interconnects may have a homogenous or heterogeneous structure. For example, each conductive feature includes a lining layer possibly having titanium, titanium nitride, tantalum or tantalum nitride; and a bulk conductive layer having copper, tungsten, aluminum, or aluminum alloy. In another example, the conductive features are formed in a damascene process, including trench etch, deposition and chemical mechanical polishing (CMP).

The integrated circuit 300 also includes one or more magnetic tunnel junction (MTJ) 330 as illustrated in FIG. 4. The MTJ 330 is interposed between a bottom electrode 332 and a top electrode 334, and is further coupled to various features, such as the MOS transistor 312, through the interconnects. In one embodiment, the MTJ 330 is the memory device 100 of FIG. 1 (except for the bottom and top electrodes being separately illustrated and labeled in FIG. 4). For example, the MTJ 330 includes a first free layer having a first coercivity and a second free layer having a second coercivity less than the first coercivity. The first free layer is adjacent the barrier layer. The second free layer is interposed between the top electrode and the first free layer.

In another embodiment, the MTJ 330 is the memory device 150 of FIG. 2 (similarly, the top electrode and bottom electrodes are separated represented in FIG. 4). For example, the MTJ 330 includes a first free layer having a first coercivity and a second free layer having a second coercivity less than the first coercivity. The first free layer and the second free layer are interposed by a buffer layer of non-magnetic material. In one example, the buffer layer includes tantalum. The first free layer is adjacent the barrier layer. The second free layer is adjacent the top electrode.

In another embodiment, the MTJ 330 is the memory device 200 of FIG. 3. For example, the MTJ 330 includes a first free layer, a second free layer, and a third free layer. The MTJ 330 further includes a first buffer layer interposed between the first and second free layers. The MTJ 330 further includes a second buffer layer interposed between the second and third free layers. The first free layer is adjacent the barrier layer. The second free layer is adjacent the top electrode. In one example, the first buffer layer includes tantalum. In another example, the second buffer layer includes Ru/Cu.

When forming the MTJ 330, various material layers are formed on the substrate with composition and configuration in compliance with one of the various embodiments of the MTJ 330 described above. In another embodiment, an additional processing step is applied to the MTJ 330. The additional process step includes an annealing process. The annealing process and an external magnetic field are simultaneously applied to the MTJ 330. In one example, the external magnetic field has a magnetic intensity ranging between about 1000 and about 2000 Oersted. In another example, the annealing process has an annealing temperature ranging between about 200° C. and 400° C.

Other features may be further included in the integrated circuit 300 and various processes can be implemented to form the other features. In one example, the MTJ 330 and the MOS transistor 312 are configured to form a random access memory (RAM) device, also referred to as STT-MRAM device. In another example, a plurality of STT-MRAM devices are incorporated in the integrated circuit 300 and configured in an array to enable large volume data access. In another embodiment, the thickness of the first buffer layer (or the second buffer layer) is in an optimized range such that a long range coupling between the two adjacent free layers presents to enable tuning the writing current and the MR((R_high−R_low)/R_low). By implementing the disclosed structure in one or more embodiment, the writing current is reduced without degrading MR and/or thermal stability. In another example, a silicidation process is applied to the source and drain 314 to form metal silicide with reduced contact resistance. The silicidation process may be applied to the polysilicon gate electrodes and the source/drain regions simultaneously.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor memory device, comprising:
   a bottom electrode over a semiconductor substrate;
   an anti-ferromagnetic layer disposed over the bottom electrode;
   a first pinned layer disposed over the anti-ferromagnetic layer;
   a barrier layer disposed over the first pinned layer;
   a first ferromagnetic layer disposed over the barrier layer;
   a second ferromagnetic layer disposed over the first ferromagnetic layer;
   a buffer layer interposed between the first ferromagnetic layer and the second ferromagnetic layer, wherein the buffer layer is a crystal material with a crystal structure substantially compatible with at least one of the first ferromagnetic layer and the second ferromagnetic layer; and
   a top electrode disposed over the second ferromagnetic layer.

2. The device of claim 1, wherein the buffer layer including tantalum.

3. The device of claim 1, wherein the buffer layer includes a thickness ranging between about 4 angstrom and about 12 angstrom.

4. The device of claim 1, wherein the buffer layer includes:
   a tantalum layer;
   a third ferromagnetic layer on the tantalum layer; and
   a Ru/Cu layer disposed on the third ferromagnetic layer.

5. The device of claim 1, wherein the buffer layer includes a material having a non-periodic structure.

6. The device of claim 1, wherein the buffer layer is an amorphous material.

7. The device of claim 1, wherein the first ferromagnetic layer includes a first coercivity and the second ferromagnetic layer includes a second coercivity that is less than the first coercivity.

8. The device of claim 1, wherein the first ferromagnetic layer includes a CoFeB film, and the second ferromagnetic layer includes a NiFe film.

9. The device of claim 8, wherein the CoFeB film has a thickness ranging between about 10 angstrom and the about 30 angstrom, and the NiFe has a thickness ranging between about 5 angstrom and about 30 angstrom.

10. The device of claim 1, further comprising:
    a spacer layer interposed between the first pinned layer and the barrier layer; and
    a second pinned layer interposed between the spacer layer and the barrier layer.

11. The device of claim 10, wherein:
    the first pinned layer and the second pinned layer each includes CoFeB;
    the spacer layer includes ruthenium (Ru); and
    the barrier layer includes a MgO film.

12. A semiconductor memory device, comprising
    a first electrode over a semiconductor substrate;
    an anti-ferromagnetic layer over the first electrode;
    a bottom pinned layer over the anti-ferromagnetic layer;
    a spacer layer over the bottom pinned layer;
    a top pinned layer over the spacer layer;
    a barrier layer over the top pinned layer;
    a first ferromagnetic layer over the barrier layer;
    a second ferromagnetic layer disposed directly on the first ferromagnetic layer; and
    a second electrode adjacent the second ferromagnetic layer.

13. The device of claim 12, wherein the first ferromagnetic layer includes CoFeB.

14. The device of claim 12, wherein the first ferromagnetic layer includes a thickness between about 10 angstrom and about 20 angstrom, and wherein the second ferromagnetic layer includes a thickness less than about 15 angstrom.

15. The device of claim 12, wherein the second ferromagnetic layer includes NiFe.

16. The device of claim 12, wherein the first ferromagnetic layer includes a first coercivity and the second ferromagnetic layer includes a second coercivity that is less than the first coercivity.

17. A method of manufacturing a semiconductor memory device, comprising:
    forming a first electrode over a semiconductor substrate;
    forming an anti-ferromagnetic layer over the first electrode;
    forming a pinned layer over the anti-ferromagnetic layer;
    forming a barrier over the pinned layer;
    forming a first ferromagnetic layer over the barrier layer;
    forming a second ferromagnetic layer directly on the first ferromagnetic layer; and
    forming a second electrode adjacent the second ferromagnetic layer.

18. The method of claim 17, further comprising simultaneously performing an annealing process to and applying an external magnetic field to the semiconductor memory device.

19. The method of claim 18, wherein the external magnetic field includes a magnetic intensity ranging between about 1000 and about 2000 Oersted and the annealing process includes an annealing temperature ranging between about 200° C. and 400° C.

20. The method of claim 17, wherein the first ferromagnetic layer includes a first coercivity and the second ferromagnetic layer includes a second coercivity that is less than the first coercivity.

* * * * *